US006806653B2

(12) United States Patent
Strang et al.

(10) Patent No.: US 6,806,653 B2
(45) Date of Patent: Oct. 19, 2004

(54) METHOD AND STRUCTURE TO SEGMENT RF COUPLING TO SILICON ELECTRODE

(75) Inventors: Eric J. Strang, Chandler, AZ (US); Andrej S. Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/355,203

(22) Filed: Jan. 31, 2003

(65) Prior Publication Data

US 2003/0141795 A1 Jul. 31, 2003

Related U.S. Application Data

(60) Provisional application No. 60/352,554, filed on Jan. 31, 2002.

(51) Int. Cl.[7] ............................ H01J 7/24; C23C 14/00; C23C 16/00
(52) U.S. Cl. ............................ 315/111.71; 315/111.41; 204/298.06; 204/298.09; 118/723 E
(58) Field of Search ........................ 315/111.71, 111.41, 315/111.21; 204/298.06, 298.09, 298.11, 298.15; 118/723 E, 723 R, 723 MA; 156/345.47, 345.3, 345.1

(56) References Cited

U.S. PATENT DOCUMENTS 4,986,890 A * 1/1991 Setoyama et al. ..... 204/298.06
5,651,867 A * 7/1997 Kokaku et al. ........ 204/298.25
5,965,250 A * 10/1999 Takeuchi et al. ......... 428/308.4
6,462,482 B1 * 10/2002 Wickramanayaka et al. ..................... 315/111.21
6,669,811 B2 * 12/2003 Hao et al. ................. 156/345.3

OTHER PUBLICATIONS

Parsons, PCT/US02/37326 Nov. 21, 2002.
U.S. patent application Ser. No. 10/218,036, Windhorn, filed Aug. 14, 2002.
U.S. patent application Ser. No. 10/227,527, Long, filed Aug. 26, 2002.
U.S. patent application Ser. No. 10/345,232, Sirkis, filed Jan. 16, 2003.
U.S. patent application Ser. No. 10/346,186, Sirkis, filed Jan. 17, 2003.
U.S. patent application Ser. No. 10/345,290, Sirkis, filed Jan. 16, 2003.

* cited by examiner

Primary Examiner—Tuyet Thi Vo
(74) Attorney, Agent, or Firm—Pillsbury Winthrop LLP (57) ABSTRACT

An electrode assembly for use in a plasma processing system including a base electrode adapted to be coupled to a source of RF energy, a removable electrode removably coupled to the base electrode, and a material interposed between a surface of the base electrode and a surface of the removable electrode.

24 Claims, 6 Drawing Sheets

METHOD AND STRUCTURE TO SEGMENT RF COUPLING TO SILICON ELECTRODE

This application derives the benefit of U.S. Provisional application No. 60/352,554, filed Jan. 31, 2002, the contents of which are incorporated herein by reference.

FIELD OF THE INVENTION

The present invention pertains to electrodes used in plasma processing.

BACKGROUND OF THE INVENTION

Plasma processing systems are used in the manufacture and processing of semiconductors, integrated circuits, displays and other devices and materials, to remove material from or to deposit material on a substrate such as a semiconductor substrate. In some instances, these plasma processing systems use electrodes for providing RF energy to a plasma useful for depositing or removing material on a substrate.

There are several different kinds of plasma processes used during wafer processing. These processes include, for example: plasma etching, plasma deposition, plasma assisted photoresist stripping and in-situ plasma chamber cleaning.

When it is desired to deposit materials onto a semiconductor wafer, a plasma reactor is sometimes used to deposit a variety of materials, for example, copper or silicon dioxide, using techniques such as plasma enhanced chemical vapor deposition (PE-CVD) or physical vapor deposition (PVD). In copper PVD applications, a copper target, exposed to ion bombardment, is utilized to provide a source of material for deposition on a surface of the semiconductor wafer to form the desired wafer topography. In oxide film formation using chemical vapor deposition (CVD), for example, silane ($SiH_4$) and $N_2O$ are introduced into the process chamber wherein the product $SiO_2$ is adsorbed onto the wafer surface and the additional products diatomic hydrogen ($H_2$) and diatomic nitrogen ($N_2$) are pumped away.

A problem that has plagued prior art plasma reactors is the control of the plasma to obtain uniform workpiece etching and/or deposition. In plasma reactors, the degree of etch or deposition uniformity is determined by the uniformity of the plasma properties. The latter is dictated by the design of the overall system, and in particular the design of the electrodes used to create the plasma in the interior of the reactor chamber.

BRIEF SUMMARY OF THE INVENTION

The present invention provides an electrode assembly for use in a plasma processing system including a base electrode adapted to be coupled to a source of RF energy, a removable electrode removably coupled to the base electrode, and a material interposed between a surface of the base electrode and a surface of the removable electrode.

In one embodiment, the material interposed between a surface of the base electrode and a surface of the metal electrode can be a thin film layer deposited for example on the surface of the removable electrode such that the thin layer comes in contact with the base electrode. Alternatively, the material interposed between a surface of the base electrode and a surface of the metal electrode can be a thin film layer deposited on the surface of the base electrode such that the thin layer comes in contact with the removable electrode.

In one embodiment, the removable electrode is comprised of a semiconductor material. In another embodiment, the removable electrode is comprised of silicon. In one embodiment the thin layer is deposited in a pattern such as, but not limited to, a plurality of concentric rings and pie-shapes. The thin layer deposited in each of the concentric rings or pie-shapes can be of different materials such as a material with different dielectric constant, an electrically conductive material or materials having different radio frequency loss characteristics.

BRIEF DESCRIPTION OF THE DRAWINGS

The above described and other features of the present invention will be described while referring to the accompanying drawings in which.

DETAILED DESCRIPTION OF EMBODIMENTS OF THE INVENTION

Figure 1:
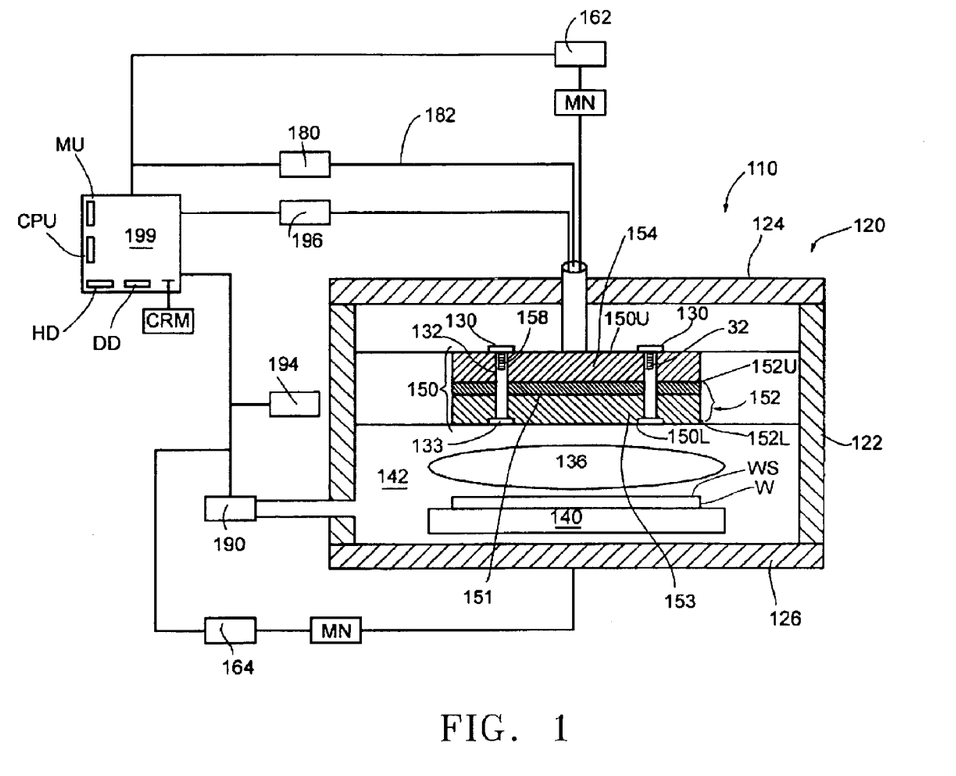
FIG. 1 is a schematic representation of one embodiment of a plasma deposition and etching system according to the present invention.

Referring now to FIG. 1, a plasma processing system 110 is shown to include, a plasma chamber 120 that functions as a vacuum processing chamber adapted to perform plasma etching from and/or material deposition on workpiece W. Here, workpiece W is a semiconductor wafer, such as, for example, silicon, and has an upper surface WS. Chamber 120 includes sidewalls 122, an upper wall 124 and a lower wall 126 that enclose an interior region 142 capable of supporting plasma 136. Chamber 120 further includes within region 142, a workpiece support 140 arranged adjacent lower wall 126 for supporting workpiece W while the workpiece is processed in chamber 120. The workpiece W may be, for example, a semiconductor substrate, such as silicon.

Chamber 120 of system 110 includes an electrode assembly 150 arranged within interior region 142 adjacent workpiece support 140. Electrode assembly 150 is capacitively coupled to workpiece W when the workpiece is being plasma processed. Electrode assembly 150 includes an upper surface 150U facing away from workpiece support 140 and a lower surface 150L facing towards workpiece support 140. Plasma 136 is formed in interior region 142. Plasma 136 may have a plasma density (i.e., number of ions/volume, along with energy/ion) that is uniform, unless the density needs to be tailored to account for other sources of process non-uniformities or to achieve a desired process non-uniformity. The density of plasma 336 has a spatial distribution above the wafer referred to herein as a "plasma density profile."

As will be described in more detail below, electrode assembly 150 further includes a base electrode 154 which has coupled thereto a removable electrode 152 having an upper surface 152U and a lower surface 152L. Upper surface 152U is the contact surface between removable electrode 152 and base electrode 154. According to the present invention, removable electrode 152 may include layer 151 on surface portion 153 of removable electrode 152 thereby creating an interface where base electrode 154 meets removable electrode 152. Alternatively, layer 151 may also be deposited on a surface of base electrode 154 where the base electrode comes in contact with removable electrode 152.

Electrode assembly 150 may be electrically connected to an RF power supply system 162. RF power supply 162 may have coupled thereto an associated match network MN to match the impedance of electrode assembly 150 and the associated excited plasma 136 to the source impedance of RF power supply system 162, thereby increasing the power that may be delivered by the RF power supply 160 to the plasma electrode assembly 150 and the associated excited plasma 136. The plasma density of plasma 136 generally increases as the power delivered by RF power supply 162 to plasma 136 increases. Hence, for a given RF power supply system, the maximum attainable plasma density of plasma 136 may be increased by means of the matching network. Moreover, workpiece holder 140 used to support wafer W may have an RF power supply 164 coupled thereto to bias the wafer W. A RF bias can be applied to wafer support 140 through a match network MN from RF generator 164.

Plasma processing system 110 further includes a gas supply system 180 in pneumatic communication with plasma chamber 120 via one or more gas conduits 182 for supplying gas in a regulated manner to form plasma 136. Gas supply system 180 supplies such gases as chlorine, hydrogen-bromide, octafluorocyclobutane, and various other fluorocarbon compounds, and for chemical vapor deposition applications supplies silane, tungsten-tetrachloride, titanium-tetrachloride, and the like.

Plasma processing system 110 also includes a vacuum system 190 connected to chamber 120 for evacuating interior region 142 to a pressure that depends on the nature of the plasma desired.

Plasma processing system 110 may further include a workpiece handling and robotic system 194 in operative communication with chamber 120 for transporting workpieces W to and from workpiece support 140. In addition, a cooling system 196 in fluid communication with electrode assembly 150 is preferably included for flowing a cooling fluid to and from the electrode.

Plasma processing system 110 may further include a main control system 199 to which RF power supply systems 162 and 164, gas supply system 180, vacuum system 190, and work piece handling and robotic system 194 are electronically connected. In one embodiment, main control system 199 is a computer having a memory unit MU having both a random access memory (RAM) and a read-only memory (ROM), a central processing unit CPU, and a hard disk HD, all in electronic communication. Hard disk HD serves as a secondary computer-readable storage medium, and may be for example, a hard disk drive for storing information corresponding to instructions for controlling plasma system 110. The control system 199 may also include a disk drive DD, electronically connected to hard disk HD, memory unit MU and central processing unit CPU, wherein the disk drive is capable of reading and/or writing to a computer-readable medium CRM, such as a floppy disk or compact disc (CD) on which is stored information corresponding to instructions for control system 199 to control the operation of plasma processing system 110.

It is also contemplated that main control system 199 has data acquisition and control capability. One potential control system 199 is a computer, such as a DELL PRECISION WORKSTATION 610™, available from Dell Computer Corporation, Dallas, Tex. As will be appreciated by those of skill in the art, data acquisition and control may be facilitated by coupling the electronic control systems associated with each of the subsystems 162, 164, 180, 190, 194, and 196 mentioned above via the workstation's serial or parallel ports or may require additional hardware (not shown) coupled between main control system 199 and subsystems 162, 164, 180, 190, 194 and 196.

According to one embodiment of the present invention, an electrode assembly is provided for use in a plasma processing system that allows a removable electrode to be fastened to a base electrode. Referring again to FIG. 1, one embodiment of electrode assembly 150 will be discussed. Removable electrode 152, which is for example made of silicon, includes layer(s) 151 on the backside or upper surface of base material 153 of removable electrode 152. Layer(s) 151 in turn provides the upper surface 152U (i.e. contact surface) of removable electrode 152. Alternatively, layer(s) 151 may be deposited on base electrode 154 and thus provide and interface between removable electrode 152 and base electrode 154. Layer 151 may be provided by any of a group of well-known physical deposition procedures, such as CVD or PVD. Layer 151 may have a variable thickness that is typically on the order of one to ten microns. With layer 151, the RF coupling from base electrode 154 to removable electrode 152 is controlled.

Figure 2:
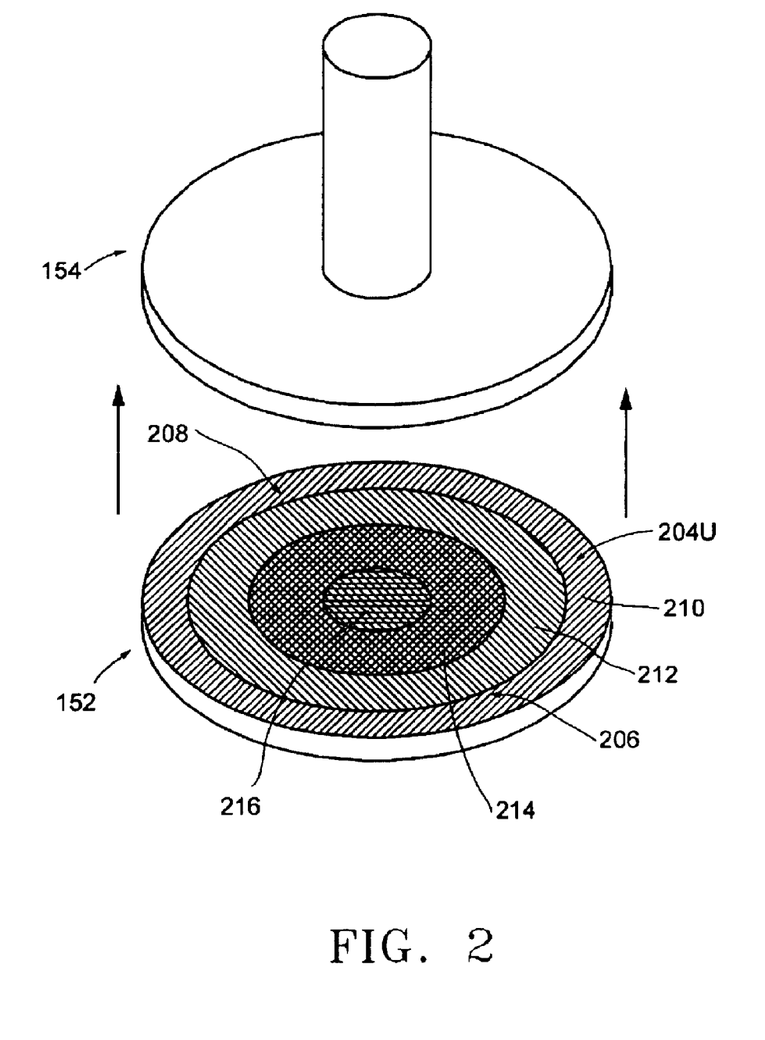
FIG. 2 is an elevational view of one embodiment of a removable electrode of the plasma deposition and etching system of the present invention.

FIG. 2 shows a schematic representation of an electrode assembly according to one embodiment of the present invention. Electrode assembly 150 comprises base electrode 154 and removable electrode 152. The upper surface 204U of removable electrode 152 provides the contact surface between removable electrode 152 and base 154, and comprises layer 206 deposited in a pattern comprising a series of concentric rings 208. The material deposed in concentric rings 208 is illustrated in this figure with different hatched lines to indicate that different materials are used in each ring. For example, ring 210 has thin film material A, ring 212 has thin film material B, ring 214 has thin film material C and finally disc 216 has material D.

In one embodiment, the thin film rings comprise dielectric materials wherein, for example, each dielectric material in a ring is selected having a different dielectric constant. This would affect the spatial distribution (e.g., radially) of the capacitive coupling of the RF power from the base 154 to the removable electrode 152. Specifically, the spatial distribution of material films with different properties in the form of concentric rings 210, 212, 214, 216, etc. on surface 204U of removable electrode 152 allows for tailoring the radial width of each concentric ring of material as well as selection of the electrical properties of the material film forming each concentric ring. This spatial distribution of material films affects the coupling of RF power to the plasma, hence affecting the radial uniformity of the process. The electrical properties (e.g., dielectric constant, etc.) and the radial extent of the film can directly affects the electrical path by which RF energy propagates on the RF structure and, therefore, affects the interaction between the RF electrode and the plasma.

In another embodiment, the thin film materials in the rings (i.e., 210, 212, 214, 216) can be made of a combination of different dielectric and electrically conductive materials. For example, as shown in FIG. 2 in conjunction with FIG. 3, disk 316 in the center of removable electrode 304 can be made of a conductive material while the concentric rings 210, 212 and 214 can be made from a thin film dielectric material. It is expected that the placement of the conductive material plates or films could affect the direction of propagation of the RF field through the electrode. Alternatively, disk 316 in the center of removable electrode 304 can be made of a dielectric material while the concentric rings 210, 212 and 214 can be made from a thin film of conductive material. Similar to the previous embodiment, the spatial distribution of material plates or films and/or disk with different properties in the form of concentric rings 210, 212, 214, and disk 316 allows for tailoring the radial width of each concentric ring or disk of material as well as selection of the electrical properties of the material film forming each concentric ring or disk. This spatial distribution of material films affects the coupling of RF power to the plasma, hence affecting the radial uniformity of the process.

In an alternative embodiment, each ring can be made of a different electrically conductive material with differing resistivities. In one embodiment, each ring may be made from RF absorbing materials such as materials available in the industry under the tradename ECCOSORB® CR castable resin family, marketed by Emerson & Cuming Microwave Products, Inc. of Canton, Mass. For example, each ring can be made of a material having different RF loss characteristics, such as materials having differing amounts of loaded iron powder. For example ECCOSORB® CR castable resin family consist of iron powder loaded epoxy resins having very low loss at frequencies below 100 MHz, but present a progressively higher attenuation as frequency increases beyond this frequency value. The family includes over a dozen types of absorber resins, of varying levels of RF attenuation. One example of an ECCOSORB® material that could be used in the present invention is a castable absorber sold under the product designation CR-117. The materials in the rings can also be made of a combination of any of materials including dielectric, electrically conductive and RF absorbing materials. That is, each ring may be a combination of materials, or the material may vary from ring to ring. As stated previously, radially tailoring the RF absorption in the electrode structure can affect the radial distribution of the plasma density.

Figure 4:
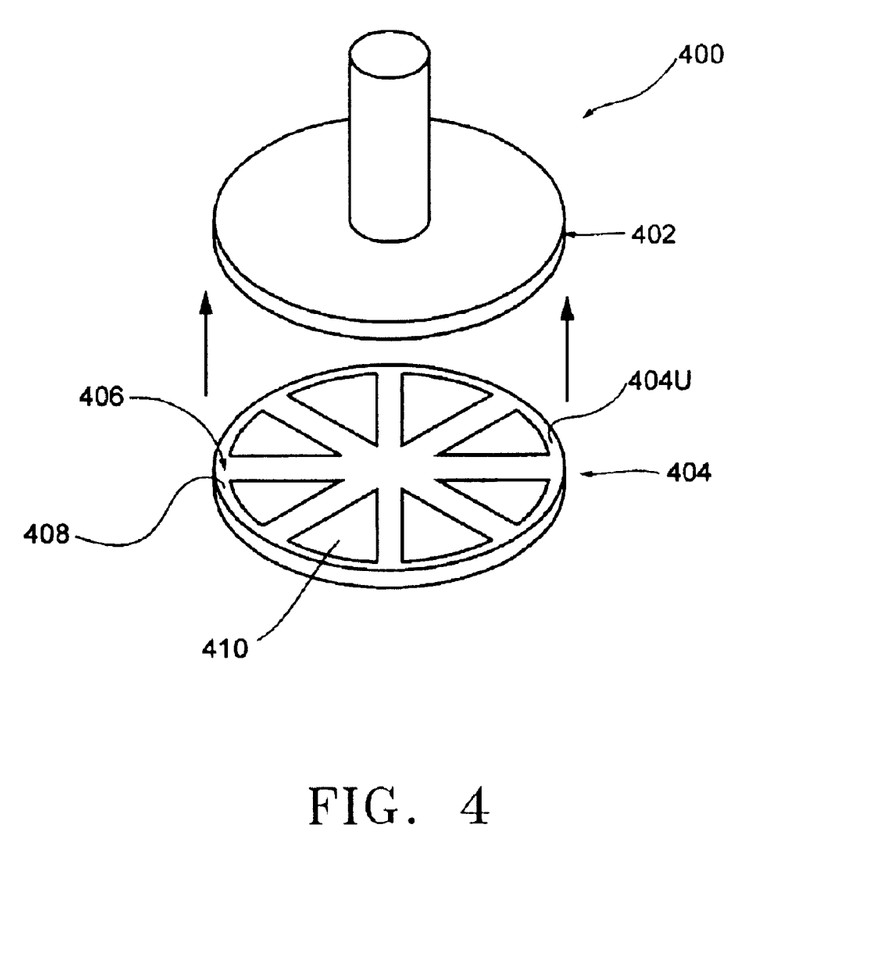
FIG. 4 is an elevational view of an alternative embodiment of a removable electrode of the plasma deposition and etching system of the present invention.

In one embodiment, the series of rings 208 illustrated in FIG. 2 may be replaced by an ensemble of pie-sections, as shown in FIG. 4. Similarly to the embodiment illustrated in FIG. 2, electrode assembly 400 comprises base electrode 402 and removable electrode 404. The upper surface 404U of removable electrode 404, in contact point between removable electrode 404 and base 402, comprises layer 406 deposited in a pattern comprising an ensemble of pie-sections 408. The material deposited in each pie-section (i.e., pie-section 410) is selected according to desired distribution of RF energy. For example, the pie-sections 408 can be made from thin film materials having different dielectric constants. Alternatively, the layer 406 may be deposited on lower surface of base electrode 402 where the base electrode comes in contact with the removable electrode. Spatially distributing material films with different properties in the azimuthal direction as pie-sections 408 on surface 404U of removable electrode 404 allows for tailoring the azimuthal width of each pie-section of material and the electrical properties of the material film forming each pie-section in order to affect the coupling of RF power to the plasma and, hence, optimize the azimuthal uniformity of the process. The electrical properties (e.g., dielectric constant, etc.) and the azimuthal extent of the film directly affects the electrical path by which RF energy propagates on the RF structure and, therefore, affects the interaction between the RF electrode and the plasma.

Figure 3:
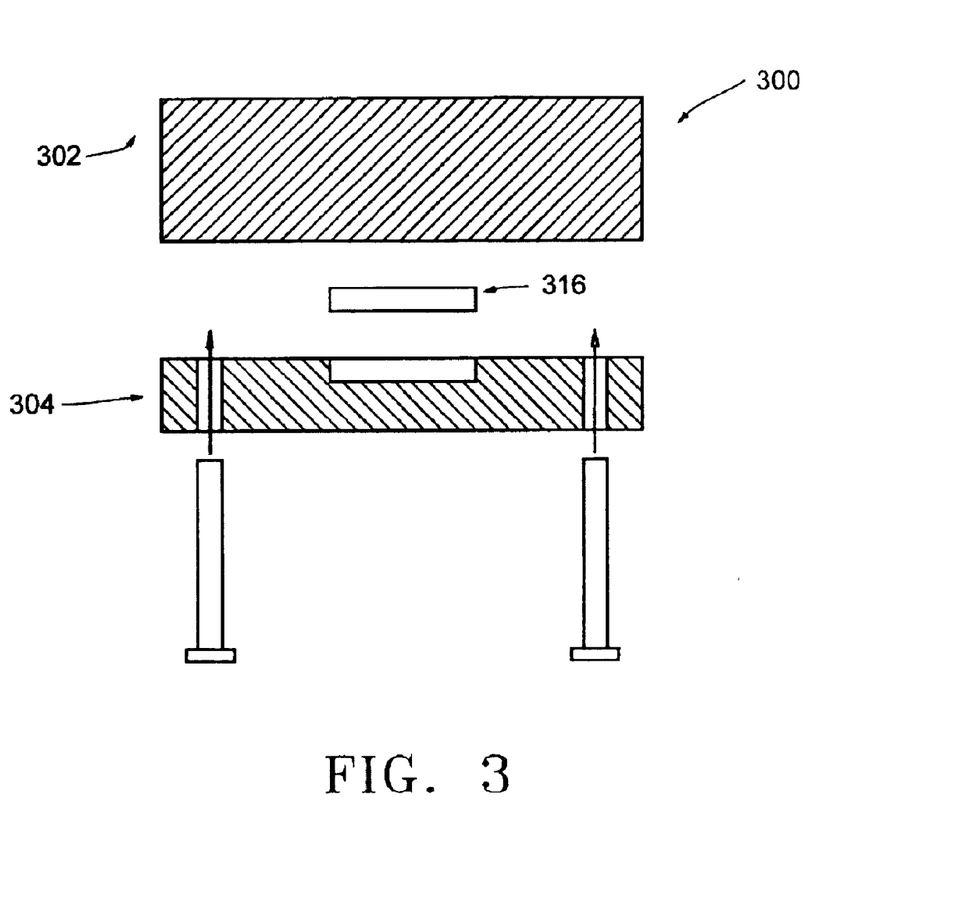
FIG. 3 is a cross-sectional view of another embodiment of a removable electrode of the plasma deposition and etching system of the present invention.

In one embodiment, the pattern of thin film materials illustrated in FIG. 2 and FIG. 4 or inserts as shown in FIG. 3 may comprise materials having different thicknesses such that the contact surface between the base electrode 154, 302 and 402 and the removable electrode 152, 304 and 404 is spatially altered.

Referring back to FIG. 1, during operation of plasma system 110, RF energy applied to base electrode 154 is coupled to removable electrode 152 thereby providing the required electrical potential between removable electrode 152 and workpiece W to enable the formation of plasma 136.

In one embodiment, the base electrode 154 and the removable electrode 152 can be coupled in a capacitive arrangement. In this instance, the interface between the removable electrode and the base electrode is a dielectric, i.e., the layer or layers interposed between the two electrodes consist of a dielectric material. Hence, a displacement current flows between the effective capacitor plates (base electrode 154 and removable electrode 152) to cause the desired electrical coupling between base electrode 154 and removable electrode 152. Assuming a relatively constant surface area associated with removable electrode 152 and base electrode 154, the magnitude of the capacitance associated with electrode assembly 150 is determined by the thickness and pattern of thin film layer(s) 151. Therefore, controlling the thickness and the pattern of layer 151 allows for accurate control of the electrical characteristics of electrode assembly 150. Layer 151 is preferably free of pinholes and/or be sufficiently thick to prevent voltage breakdown between base electrode 154 and silicon electrode base material 153.

In addition to the enhanced electrical characteristics associated with providing thin layer 151 on removable electrode 152, elimination of the metal-to-semiconductor contact (i.e. electrically conducting contact) results in a reduction in the force required to maintain a repeatable and reliable coupling between the two. In one embodiment, electrode 152 may be coupled to base electrode 154 with a plurality of threaded fasteners or bolts 130 inserted and coupled to mating insert sleeves 132. In one embodiment, insert sleeves 132 are preferably constructed of a non-reactive material such as polytetrafluoroethylene (PTFE) and include a retaining portion 133 that is drawn against surface 150L of electrode assembly 150 in response to threading of fastener 130 into insert sleeve 132. Other materials such as Nylon, Vespel® or Delrin® may be used for insert sleeve 132 instead of PTFE. The material chosen should possess approximately the same properties as PTFE in terms of strength and reactivity during plasma processing. Insert sleeves 132 are preferably inserted through holes in removable electrode 152 and corresponding holes in base electrode 154. Also, according to one embodiment, each insert sleeve 132 is tapered on the outer diameter and along its longitudinal axis.

More specifically, each insert sleeve 132 may be tapered on the outer diameter and along its longitudinal axis, wherein the outer diameter increases from the bottom, adjacent retaining portion 133, to the top, adjacent fastener 130. Two diametrically opposite slits can be formed in sleeve 132 to extend in a direction along its longitudinal axis. For insertion into associated holes in electrodes 152 and 154, sleeve 132 may be depressed radially inwardly, or squeezed, in the direction to narrow the slits. The slits may extend along the length of the internally threaded section 158 of sleeve 132 or they may extend further along the sleeve if the slit or cut extends through the centerline of the sleeve. Once sleeve 132 is inserted, radially outward expansion of the sleeve will hold it in place by means of friction, i.e. sleeve 132 will not fall out of the hole when threaded fastener 130 is inserted into internally threaded section 158 of sleeve 132. Such a form of construction for each sleeve 132 is disclosed in the copending Provisional applications Nos. 60/219,735 entitled "Improved Electrode for Plasma Processing System" and 60/219,453 entitled "Electrical Apparatus and Method for Plasma Processing" the contents of which are incorporated herein by reference. The co-pending applications disclose other embodiments of sleeves 332 that can be employed in systems according to the present invention.

Figure 5:
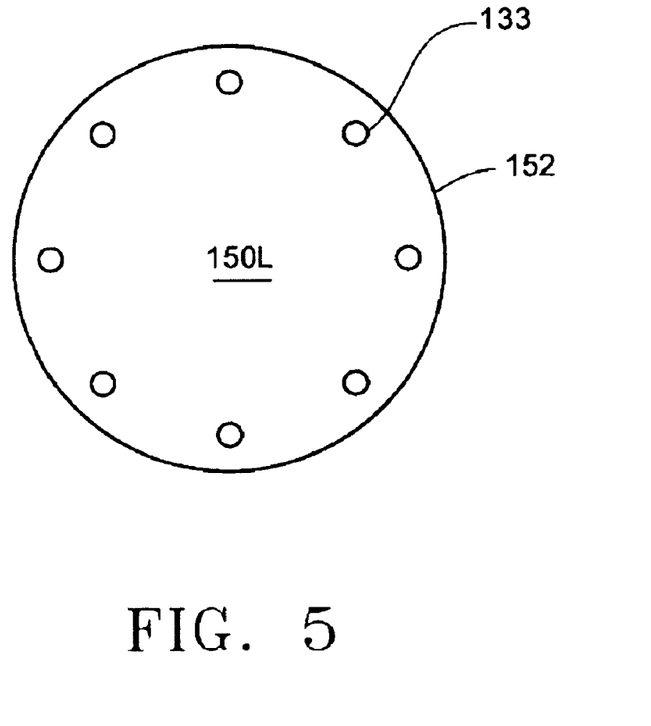
FIG. 5 is a frontal view of the lower part of the removeable electrode according to the present invention.

FIG. 5 shows a frontal-view of lower surface of electrode assembly 150L, shown in a transversal view in FIG. 1. One embodiment of electrode assembly 150 includes a plurality of threaded inserts 132, spaced azimuthally about the proximate perimeter of removable electrode 152. FIG. 5 shows only associated retaining portions 133 of threaded inserts 132. In this embodiment, eight inserts are shown with their associated retaining portions 133. However, additional or fewer bolt/fastener combinations may be employed depending on the particular system construction.

Insert sleeves 132 expand laterally as threaded fasteners 130 are screwed into them to draw removable electrode 152 into contact with base electrode 154. Consequently, friction force between sleeves 132 and the mounting holes prevent insert sleeves 132 from rotating within their respective mounting holes when the torque applied to threaded fasteners 130 increases. Alternatively, insert sleeves 132 could be provided with a square section recessed into a square hole (or, more generally, a non-circular section recessed in a correspondingly shaped hole). The use of insert sleeves 132 isolates threaded fasteners 130 completely from the vacuum chamber 120 and thus can eliminate the need for a quartz shield ring.

As an alternative to the threaded fastener/insert sleeve combination described above, base electrode 154 may be provided with threaded mounting holes in place of the smooth bore holes described above. Then, insert sleeves 132 may be replaced with bolts constructed of the same material as insert sleeves 132 (e.g. PTFE), while having a thread which mates with the threaded mounting holes in base electrode 154. With this arrangement, the removable electrode may be secured to the base electrode 152 by passing the threaded bolts through holes in the removable electrode 152 and securing them to corresponding threaded holes in base electrode 154. Tightening the bolts causes the associated bolt heads to bear against surface 150L of removable electrode 152 and draw removable electrode and base electrode 154 together. If an insulating material chosen for the fastening bolts is not compatible with the plasma process, then the standard quartz shield ring may be employed to cover the bolt ends.

According to another aspect of embodiments of the present invention, an electrode assembly for use in a plasma processing system is provided that includes a surface profile that is substantially non-planar. For example, and as will be discussed below, the surface of the base may be convex in shape. By providing a non-planar base electrode the contact between the removable electrode and the base electrode may be improved.

Figure 6A:
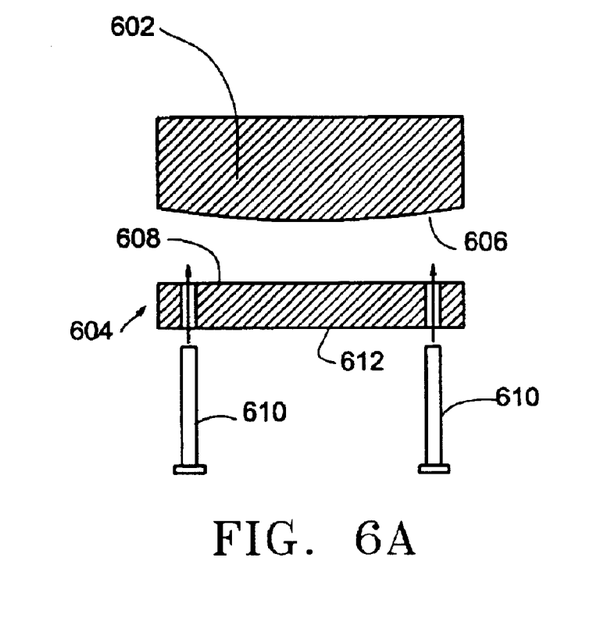
FIG. 6A is a cross-sectional view of another embodiment of a removeable electrode according to the present invention.
Figure 6B:
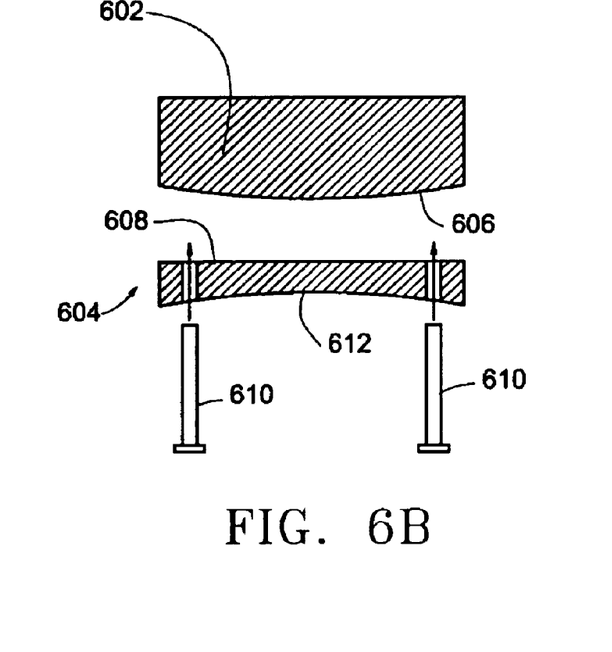
FIG. 6B is a cross-sectional view of still another embodiment of a removeable electrode according to the present invention.

In particular FIG. 6 shows a transversal cut-off view of an electrode assembly 600 according to one embodiment of the present invention. The slightly convex surface 606 (i.e., curved shape) of the base electrode allows for improved contact between the base electrode 602 and the removable electrode 604. Indeed, the action of pressing the removable electrode 604 against the slightly convex surface 606 of base electrode 602 can uniformly exert a mechanical pressure to markedly improve the contact between the surface 608 of removable electrode 604 and convex surface 606 of base electrode 602. As previously described, inserts or bolts 610 arranged around the periphery of removable electrode 604, as illustrated in FIG. 5 for example, may be used to press the two surfaces 606 and 608 together. Furthermore, in an alternative embodiment, the surface 612 of removable electrode 604 can be machined with a slight concavity in order to compensate for pressing and bending the source plate against convex surface. Tests by the inventors have shown that the degree of convexity and concavity which can exert a contact pressure is approximately 1 to 5 mil (25.4 $\mu$m to 127 $\mu$m) over a radius of 10 to 14 inches (25.4 cm to 35.6 cm).

Alternative embodiments include the use of the present electrode assembly in conjunction with a broad-band RF absorbing material described in a commonly assigned application entitled "Method and Device for Attenuating Harmonics in Semiconductor Plasma Processing Systems", Serial No. 60/182,187, incorporated herein by reference. To give an overview, a typical RF transmission line has a wave propagation structure filled with dielectric material. This material typically has low RF loss. Therefore, as electromagnetic energy propagates along the line, only a small fraction of the transmitted RF energy is converted into heat. Exemplary embodiments employ a special class of dielectric materials, so-called "RF absorbers" to load the, or each, transmission line which delivers RF electromagnetic energy to the plasma. These materials are typically composite materials designed to pass certain frequencies of the electromagnetic spectrum with low loss, just like normal low-loss dielectrics, and to strongly attenuate higher frequencies. If an RF absorber material is used that has high attenuation in the range of frequencies spanned by the stronger harmonics of the electromagnetic wave energy in the plasma and low attenuation of energy at the fundamental RF excitation frequency, selective attenuation of harmonics can be achieved with all the aforementioned benefits.

Alternative embodiments providing additional control of the coupling between the base electrode and the removable electrode include combining the electrode assembly of the present invention with the physical segmentation of the base electrode into a plurality of sub-electrodes described in a commonly assigned application entitled "Multi-Zone RF Electrode for Field/Plasma Uniformity Control in Capacitive Plasma Sources", Serial No. 60/185,069, incorporated herein by reference.

Alternative embodiments include using a shim or a plate interposed between the base electrode and the removable electrode. The shim or plate may have the configurations discussed in the previous embodiments such as comprising rings of different materials and/or sectors of different materials.

Although the above described electrode assembly has been described in connection with electrodes used in a plasma reactor, it should be understood that the present invention may be employed in any plasma system where a base electrode is coupled to a removable electrode to perform any sort of material deposition or removal such as plasma etching, plasma deposition including sputtering and chemical vapor deposition, plasma assisted photo-resist stripping and in-situ plasma chamber cleaning. The many features and advantages of the present invention are apparent from the detailed specification and thus, it is intended by the appended claims to cover all such features and advantages of the described apparatus which follow the true spirit and scope of the invention.

Furthermore, since numerous modifications and changes will readily occur to those of skill in the art, it is not desired to limit the invention to the exact construction and operation described herein. Moreover, the process and apparatus of the present invention, like related apparatus and processes used in the semiconductor arts tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A plasma processing system comprising:

a vacuum chamber;

a RF power supply; and an electrode assembly disposed within said vacuum chamber, said electrode assembly comprising:

a base electrode adapted to be coupled to a source of RF energy;

a removable electrode removably coupled to said base electrode; and a material interposed between a surface of said base electrode and a surface of said removable electrode.

2. An electrode assembly comprising:

a base electrode adapted to be coupled to a source of RF energy;

a removable electrode removably coupled to said base electrode; and material interposed between a surface of said base electrode and a surface of said removable electrode, wherein said material is spatially configured to affect the coupling of said RF energy between said base electrode and said removable electrode.

3. The electrode assembly of claim 1 wherein said removable electrode is comprised of a semiconductor material.

4. The electrode assembly of claim 1 wherein said removable electrode is comprised of silicon.

5. The electrode assembly of claim 2 wherein said removable electrode has holes there through, said removable electrode further comprises inserts disposed in said holes, said electrode assembly further comprises fasteners disposed in said inserts to fasten said removable electrode to said base electrode.

6. The electrode assembly of claim 2 further comprising: a plurality of inserts sleeves inserted through holes in said removable electrode and corresponding holes in said base electrode.

7. The electrode assembly of claim 2, wherein said surface of said base electrode is curved.

8. The electrode assembly of claim 2, wherein the thickness of the removable electrode varies radially such that when the removable electrode is fastened to the base electrode, the surface of said removable electrode away from said base electrode is substantially flat.

9. The electrode assembly of claim 2, wherein said base electrode is segmented into a plurality of sub-electrodes.

10. The electrode assembly of claim 2 further comprising: a plurality of threaded inserts spaced azimuthally about a proximate perimeter of said removable electrode.

11. The electrode assembly of claim 10, wherein said threaded inserts secure said removable electrode to said base electrode.

12. The electrode assembly of claim 1 wherein said material comprises a thin layer having a pattern.

13. The electrode assembly of claim 12 wherein said thin layer has a uniform thickness across said surface of said removable electrode.

14. The electrode assembly of claim 12 wherein said thin layer has a non-uniform thickness across the surface of said removable electrode.

15. The electrode assembly of claim 12 wherein said pattern comprises a plurality of pie-sections.

16. The electrode assembly of claim 15 wherein said material comprises at least one of a dielectric material and an electrically conductive material.

17. The electrode assembly of claim 15 wherein said material comprises differing amounts of loaded iron powder.

18. The electrode assembly of claim 15 wherein said material comprises different radio frequency loss characteristics.

19. The electrode assembly of claim 12 wherein said pattern comprises a plurality of concentric rings.

20. The electrode assembly of claim 19 wherein at least one of said concentric rings consists of a different material from another one of said rings.

21. The electrode assembly of claim 20 wherein said material comprises at least one of a dielectric material and an electrically conductive material.

22. The electrode assembly of claim 20 wherein said material comprises differing amounts of loaded iron powder.

23. The electrode assembly of claim 20 wherein said material comprises different radio frequency loss characteristics.

24. The electrode assembly of claim 23 wherein said thin layer deposited in at least one of said pie-sections consists of a different material from another one of said pie-sections.

* * * * *